United States Patent
Barker et al.

(10) Patent No.: US 9,784,500 B2
(45) Date of Patent: Oct. 10, 2017

(54) MEASUREMENT OF ELECTRICAL VARIABLES ON A DC FURNACE

(71) Applicant: MINTEK, Randburg (ZA)

(72) Inventors: Ian James Barker, Douglasdale (ZA); Quinn Gareth Reynolds, Sharonlea (ZA); Christopher James Hockaday, Malanshof (ZA); Dominic Timothy Jordan, Johannesburg (ZA)

(73) Assignee: MINTEK, Randburg (ZA)

( * ) Notice: Subject to any disclaimer, the term of this patent is extended or adjusted under 35 U.S.C. 154(b) by 0 days.

(21) Appl. No.: 15/024,972

(22) PCT Filed: Sep. 18, 2014

(86) PCT No.: PCT/ZA2014/000051
§ 371 (c)(1),
(2) Date: Mar. 25, 2016

(87) PCT Pub. No.: WO2015/048827
PCT Pub. Date: Apr. 2, 2015

(65) Prior Publication Data
US 2016/0258682 A1    Sep. 8, 2016

(30) Foreign Application Priority Data

Sep. 30, 2013 (ZA) .................................. 2013/08310

(51) Int. Cl.
*H05B 7/00* (2006.01)
*F27B 3/28* (2006.01)
(Continued)

(52) U.S. Cl.
CPC ................ *F27B 3/28* (2013.01); *F27B 3/085* (2013.01); *F27D 17/004* (2013.01); *F27D 21/00* (2013.01); *G01R 19/0061* (2013.01); *H05B 7/18* (2013.01); *H05B 7/20* (2013.01); *F27D 2019/0037* (2013.01)

(58) Field of Classification Search
CPC .......... F27B 3/085; F27B 3/28; F27D 17/004; F27D 21/00; F27D 2019/0037; H05B 7/18; H05B 7/20; G01R 19/0061
USPC .... 373/18, 19, 25, 60, 62, 65, 70, 102, 104, 373/105, 108, 21
See application file for complete search history.

(56) References Cited

U.S. PATENT DOCUMENTS 5,533,044 A * 7/1996 Strebel .................. H05B 7/156
373/104
5,610,937 A * 3/1997 Gaupp .................. C21C 5/5229
373/102

(Continued)

FOREIGN PATENT DOCUMENTS

JP    2007-253293      10/2007
JP    2007-253293 A  * 10/2007

OTHER PUBLICATIONS

International Search Report, PCT/ZA2014/000051, dated Jan. 25, 2016.
Written Opinion, PCT/ZA2014/000051, dated Jan. 25, 2016.

*Primary Examiner* — Hung D Nguyen
(74) *Attorney, Agent, or Firm* — Young & Thompson

(57) ABSTRACT

A method of detecting an open arc in a DC plasma arc furnace which is based on detecting a linear decrease in the log of the magnitude of the frequency spectrum of the voltage between the anode and cathode.

6 Claims, 2 Drawing Sheets

(51) Int. Cl.
    *F27D 17/00*     (2006.01)
    *F27B 3/08*     (2006.01)
    *G01R 19/00*     (2006.01)
    *H05B 7/18*     (2006.01)
    *F27D 21/00*     (2006.01)
    *H05B 7/20*     (2006.01)
    *F27D 19/00*     (2006.01)

(56) References Cited

U.S. PATENT DOCUMENTS

| | | |
|---|---|---|
| 2005/0212450 A1 | 9/2005 | Martinez et al. |
| 2006/0047452 A1 | 3/2006 | Shim et al. |
| 2011/0244412 A1* | 10/2011 | Kruger .................. C21C 5/4673 373/71 |

* cited by examiner

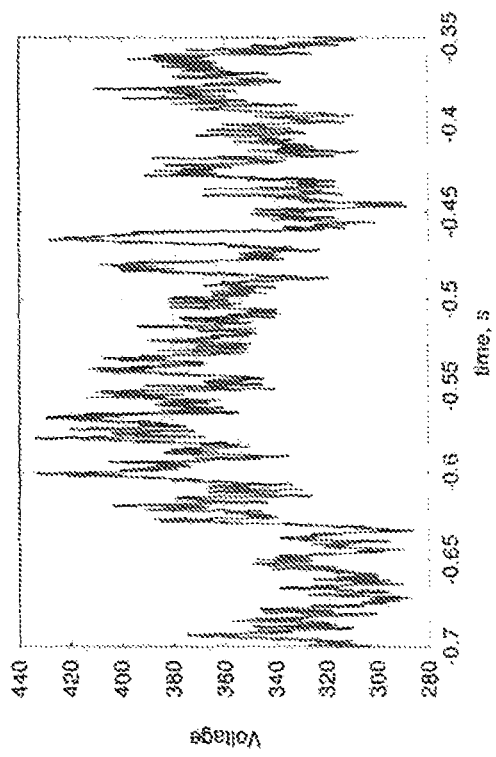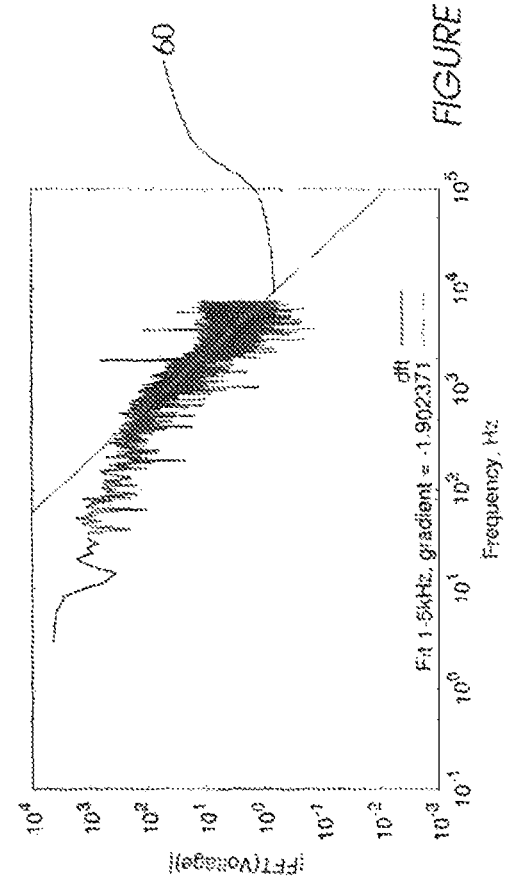

MEASUREMENT OF ELECTRICAL VARIABLES ON A DC FURNACE

BACKGROUND OF THE INVENTION

This invention relates generally to the measurement of dynamic arc behaviour in a DC plasma arc furnace.

Effective operation of a DC arc furnace is based on the presence of an open, plasma arc above a molten bath of process material. The open arc which is established in a gaseous medium above the molten bath, is a primary heating and stirring element in the furnace and is critical to the proper functioning of the furnace.

A plasma arc comprises a high temperature, high velocity jet of ionised gas which extends between an electrode tip inside the furnace, and an upper surface of the molten bath. The arc is highly conductive and completes a non-linear electric circuit between a cathode and an anode of a DC source used to supply energy to the furnace.

The furnace includes a vessel, which forms an operating volume. A process material is contained in a lower part of the operating volume. Harsh conditions prevail inside the operating volume and visibility, for practical purposes, is generally zero. It can therefore occur that a process is operated with the electrode tip in direct contact with the molten bath. In this event the arc is extinguished and power is then supplied to the furnace by resistance heating of the molten bath. This is undesirable for it negates many of the advantage of open arc operation. It is desirable therefore to be able to establish whether an arc is present or absent in the electrical circuit of the furnace.

The environment around furnace is typically hot, dusty, inhospitable and prone to electromagnetic interference. An interior of the furnace vessel poses extreme challenges for the prevailing temperature is normally above 1500° C. and there are large quantities of dust and fumes present together with a high level of ultraviolet radiation. Measurement devices, such as furnace probe cameras, ultraviolet detectors, vibration transducers and microphones which can function under these conditions are costly, normally cannot be operated continuously, and usually require significant and expensive care and maintenance to ensure a degree of reliable operation.

Various techniques have been proposed in the prior art for measuring the stability of an arc in a furnace. Citations of relevance include U.S. Pat. No. 3,767,832, U.S. Pat. No. 4,476,565, U.S. Pat. No. 4,852,119, U.S. Pat. No. 5,050,185, U.S. Pat. No. 5,351,267, U.S. Pat. No. 5,533,044, U.S. Pat. No. 8,410,800 and US2009/0232181.

U.S. Pat. No. 3,767,832 is based on detecting a current increase which occurs when an electrode contacts metal in a vessel. U.S. Pat. No. 4,476,565 relies on detecting electromagnetic emissions which are related to the position of an electrode relative to a metal bath.

U.S. Pat. No. 4,852,119 describes a technique wherein harmonics are separated from a fundamental frequency and a comparison between two resultant signals is used as a means of quantifying the degree of arcing. The approach applies to an AC furnace and would not work in a DC arc furnace because there is no fundamental frequency in a DC furnace.

U.S. Pat. No. 5,050,185 states that increased foaming of slag in a furnace causes a reduction of harmonics in the arc current and that this is reflected in the energy levels of signals produced by suitable band pass filters.

U.S. Pat. No. 5,533,044 is based on detecting the field strength of an arc.

US2009/0232181 relates that the position of a lower tip of an electrode relative to an upper surface of slag is correlated to harmonic frequencies and that if these frequencies are in the range of 100 Hz to 140 Hz the electrode tip must be repositioned. It is not apparent though why signals which lie in this frequency range are considered nor is the nature of the correlation clear.

U.S. Pat. No. 8,410,800 aims to determine "the size and shape" of material but the relevance of this to ascertaining the position of an electrode tip is apparent.

In the applicant's view the various prior art techniques do not clearly define electrical characteristic which is directly associated with an open arc in a furnace.

An object of the present invention is to provide a method of detecting an open arc in a DC arc furnace which is based on identifying a clearly defined electrical characteristic which can be determined from electrical measurements of an external circuit associated with the furnace and which does not require measurements to be taken in an interior of the furnace.

SUMMARY OF THE INVENTION

The invention provides a method of detecting an open arc in a DC plasma arc furnace which includes a power supply, and an anode and a cathode connected to the power supply, the method including the steps of:
a) measuring the magnitude of a voltage between the anode and the cathode over a time interval;
b) expressing the voltage magnitude as a function of time, over the time interval;
c) deriving from the function of time a frequency spectrum of the voltage for the time interval; and
d) examining the frequency spectrum of the voltage to determine a characteristic in the frequency spectrum which is indicative of an open arc in the furnace.

In one form of the invention, which has been substantiated by visual observations and experimental processes, the characteristic is a substantially linear decrease in the log of the magnitude of the frequency spectrum as a function of the log of the frequency.

More particularly the slope of the linear decrease is of the order of −2. Otherwise expressed the magnitude of the frequency spectrum, on a log basis, drops off at a rate of about 2 decades of magnitude for each decade of frequency.

The duration of the time interval may be variable.

The method may be repeated in each of a plurality of successive time intervals.

In each time interval the voltage may be measured continuously. However, due to practical considerations, it may be preferable to sample the magnitude of the voltage at a suitable rate which should be sufficiently high to detect fluctuations in the magnitude of the voltage which are due to circuit factors, including those which are caused by the establishment of an open arc in the furnace.

The magnitude of the voltage may be sampled at a sampling rate of not less than 15 kilo-samples per second. This value is exemplary only and is non-limiting.

The invention further extends to apparatus for detecting an open arc produced by an electrode in a DC plasma arc furnace which includes a power source and an anode and a cathode which are connected to the power source, the apparatus including a circuit for measuring the magnitude of a voltage between the anode and the cathode over a time interval, a processor which produces a frequency spectrum of the voltage over the time interval and a discriminator which examines the frequency spectrum of the voltage to determine a characteristic in the frequency spectrum which is associated with an open arc in the furnace.

The characteristic may be a substantially linear decrease in the log of the magnitude of the frequency spectrum as a function of the log of the frequency. It has been experimentally verified that, on a log basis, the magnitude of the frequency spectrum decreases at a rate of approximately 2 decades for each decade of frequency when an open arc occurs.

It has also been observed that, with a furnace operated with the electrode submerged in slag to some degree, the falloff (decrease in the log of the magnitude of the frequency spectrum) is above −1.5 decade for each decade of frequency. For the occurrence of an arc the shape of the frequency spectrum changed noticeably with a sharp knee point arising around 1 kHz. This indicates that a −2 db falloff in the 1 kHz to 5 kHz range is a suitable indicator for the presence of an open arc in a DC arc furnace.

The circuit to effect the voltage measurement may operate continuously but preferably operates at a sampling rate which is sufficiently high to detect fluctuations in the voltage which are due to circuit factors, including those which result due to the establishment of an open arc in the furnace vessel. The sampling rate may vary according to requirement and typically is at least 15 kilo-samples per second. This figure is exemplary only.

A measurement of the voltage continuously or by means of sampling process, over the time interval, enables a variation of the voltage to be expressed as a function of time. Using, for example, a Fast Fourier Transform technique, which is implemented by the processor, the frequency spectrum of the voltage is produced for the time interval.

It falls within the scope of the invention to use the apparatus to control movement of the electrode to establish the presence or absence of an arc in an operating volume of the furnace, or to obtain a measure of the magnitude (length) of the arc. Information derived from this type of apparatus can be used in a control function or to provide information which is usable as a guidance parameter by a furnace operator.

BRIEF DESCRIPTION OF THE DRAWINGS

The invention is further described by way of example with reference to the accompanying drawings in which:

FIG. 2 illustrates voltage magnitude samples plotted as a function of time; and

FIG. 3 is a Fourier spectrum on a log basis of the voltage values shown in FIG. 2 versus frequency, with a gradient fit.

DESCRIPTION OF PREFERRED EMBODIMENT

Figure 1:
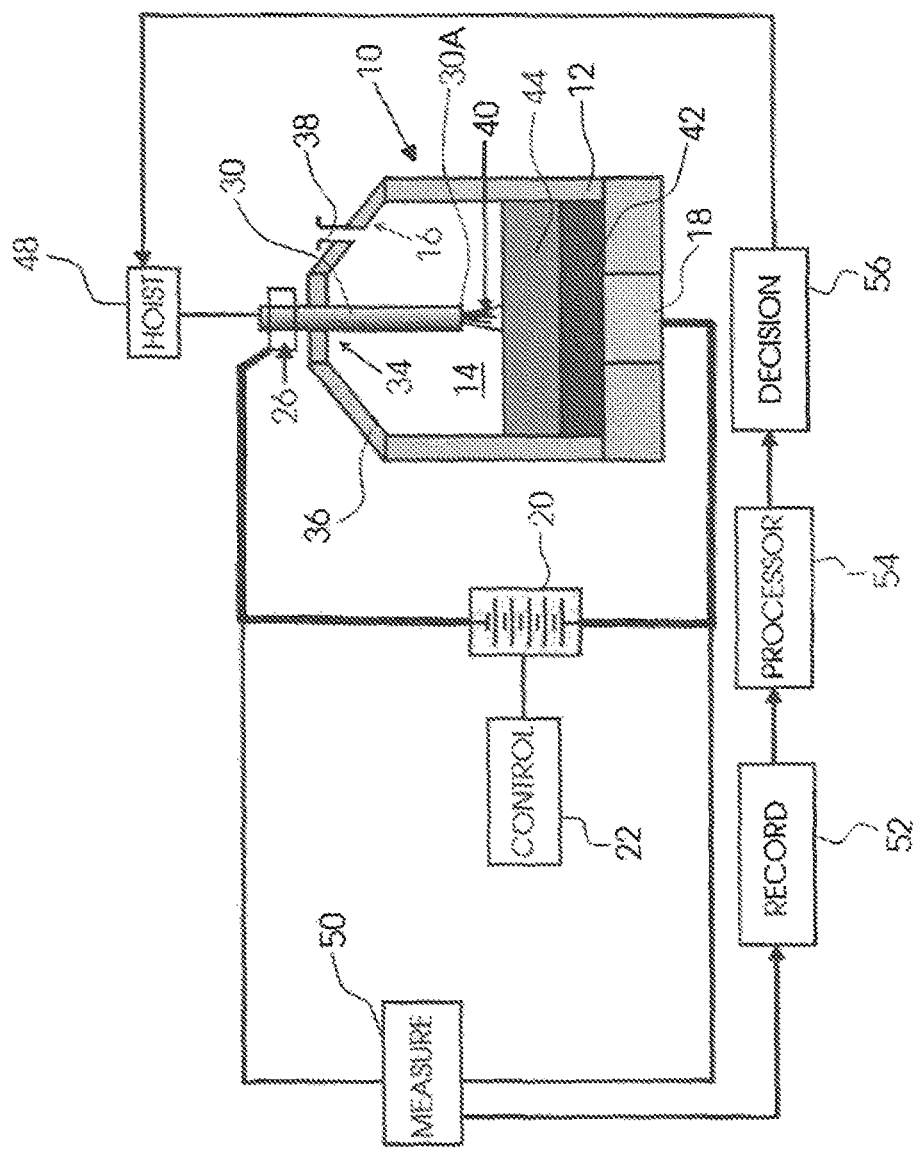
FIG. 1 illustrates a DC plasma arc furnace with apparatus for carrying out the method of the invention.

FIG. 1 of the accompanying drawings illustrates a DC plasma arc furnace 10, and components which are used to implement the method of the invention.

The DC arc furnace, which is of conventional construction, includes a vessel 12 with an internal operating volume 14. The vessel has a refractory lining 16. An anode 18 is provided in a base of the vessel. The anode is connected to a DC power supply 20 which is controlled, using various techniques, by a control unit 22.

A negative terminal of the power supply is connected to a clamp 26 which is coupled to an elongate graphite electrode 30 which extends downwardly, through an opening 34 in roof 36 of the vessel, into the operating volume 14.

The invention is described herein with reference to a furnace which makes use of a single electrode. This however is by way of example only. The principles of the invention are fully applicable to a furnace which includes two or more electrodes.

At least one feed port 38 is formed the roof. Material to be smelted is introduced into the volume 14 through this port.

In operation of the smelter an arc 40, produced in the operating volume between the feed material and tip 30A of the electrode, is used to smelt the material. Typically this causes the feed material to form a metal bath 42 at a base of the vessel and an overlying slag bath 44.

As the electrode is gradually consumed during operation it is moved by means of an electrode hoist 48 to effect a change in the position of the electrode tip inside the operating volume 14, with the intention of keeping the arc 40 in an optimum state.

The various components which have been referred to and described are conventional and are given by way of background only.

The position of the tip 30A of the electrode and conditions inside the operating volume 14, are not easily visually discernible to an operator. What can occur, under these conditions, is that the process is operated with at least the electrode tip 30A in direct contact with the molten bath 44. In this instance the arc is extinguished and power is supplied to the furnace by resistance heating of the molten bath. This may be an undesirable situation.

If the interior of the operating volume 14 were visible externally of the vessel then it would be possible, visually to ascertain the existence of the arc 40. However, the temperature in the operating volume reaches a high value, in excess of 1500° C. during operation of the furnace. Large quantities of dust and fumes are present and obscure vision. Also, high levers of ultraviolet radiation exist in the volume. Visual determination of the existence of the arc 40 is thus not reliably possible. Additionally, other techniques which might possibly be considered and which are based, for example, on the use of vibration transducers, microphones etc., cannot reliably and safely be resorted to. Also if these approaches were technically feasible the likelihood is that they would be complex and expensive.

To address the aforementioned situation and to enable the existence of an open arc in the operating volume to be detected the invention provides the various additional components shown in FIG. 1.

A voltage measurement module 50 is connected between the cathode and the anode. The module is constructed using high voltage insulated cables and strategically placed surge arresters to provide protection to sensitive elements during the measurement process.

It is possible to monitor the voltage across the furnace continuously. However, satisfactory data can be obtained by sampling the magnitude of the voltage, but at a rate which is high enough to be able to measure fluctuations which are attributable to the existence of an open arc 40 in the electric circuit. Typically a sampling rate of at least 15 kilo-samples per second is used.

The magnitude of the furnace voltage is sampled at the chosen rate over a time interval of a defined duration. The samples of the magnitude of the voltage are fed to a recorder and processor 52 which has an output connected to a further processor 54 for carrying out a Fast Fourier Transform on a basis which is described hereinafter. A discriminator 56 is used to examine the output of the processor 54.

FIG. 2 is curve, derived from experimental processes, to represent the magnitude of the furnace voltage as a function of time. Under laboratory conditions a test was carried out using an arc, established in open air, between a graphite electrode and an anode surface. The voltage was sampled at a rate of 15 kilo-samples per second over a time interval of defined duration T for a situation in which an arc is struck at the beginning of the interval T. The arc was thereafter maintained between the tip of the graphite electrode and the anode surface. The existence of the arc was confirmed visually using a high speed camera, positioned at a safe distance of about 10 meters from the experimental area. The duration of the time interval T is typically of the order of 10 milliseconds.

The data produced by the sampling process is, as noted, recorder in the component 52.

The processor 54 is used to implement a Fast Fourier Transform function, thereby to produce the frequency spectrum the furnace voltage.

FIG. 3 illustrates a log value of the furnace voltage (on a vertical axis) as a function log value of the frequency spectrum (on a horizontal axis). Over a frequency range of from about 500 Hz to 5 kHz the magnitude of the frequency spectrum drops off at rate of about 2 decades of magnitude for each decade of frequency. It is possible that the frequency spectrum may continue to drop off beyond about 5 kHz but this has not yet been experimentally determined.

A fitted gradient line 60 in FIG. 3 has a slope of about −2 and represents a falloff in the magnitude of the furnace voltage of about 2 decades per decade.

The discriminator 56 is capable of recognizing the negative slope referred to. By the use of appropriate control techniques, and in response to an output from the discriminator 56, the control device 48 is capable of automatically manipulating the position of the electrode 30 to maintain the open arc 40 inside the operating volume 14. It is also possible to make use of the information produced by the apparatus to provide one or more guidance parameters which are usable by an operator in manual or semi-automatic control of operating aspects of the furnace.

The invention claimed is:

1. A method of detecting an open arc in a DC plasma arc furnace which includes a power supply, and an anode and a cathode connected to the power supply, the method including the steps of:

a) measuring the magnitude of a voltage between the anode and the cathode over a time interval wherein the magnitude of the voltage is sampled at a sampling rate of not less than 15 kilo-samples per second;
   b) expressing the voltage magnitude as a function of time, over the time interval;
   c) deriving from the function of time a frequency spectrum of the voltage for the time interval; and
   d) examining the frequency spectrum of the voltage to determine a characteristic in the frequency spectrum which is indicative of an open arc in the furnace, wherein the characteristic is a substantially linear decrease in the log of the magnitude of the frequency spectrum as a function of the log of the frequency.

2. The method according to claim 1, wherein the slope of the linear decrease is of the order of −2.

3. The method according to claim 1, wherein steps (a), (b), (c) and (d) are repeated in each of a plurality of successive time intervals.

4. The method according to claim 3, wherein in each time interval the magnitude of the voltage is sampled to detect fluctuations in the magnitude of the voltage which are due, at least, to the establishment of an open arc in the furnace.

5. An apparatus for detecting an open arc produced by an electrode in a DC plasma arc furnace which includes a power source and an anode and a cathode which are connected to the power source, the apparatus including a circuit for measuring the magnitude of a voltage between the anode and the cathode over a time interval wherein the circuit is adapted to sample the magnitude of the voltage at a sampling rate of not less than 15 kilo-samples per second, a processor which produces a frequency spectrum of the voltage over the time interval and a discriminator which examines the frequency spectrum of the voltage to determine a characteristic in the frequency spectrum which is indicative of an open arc in the furnace, and wherein the characteristic is a substantially linear decrease in the log of the magnitude of the frequency spectrum as a function of the log of the frequency.

6. The apparatus according to claim 5 in combination with a hoist which is operable in response to an output signal of the discriminator to adjust the position of an electrode, which is connected to the cathode, in the furnace.

* * * * *